United States Patent
Shamis et al.

(10) Patent No.: US 8,176,242 B1
(45) Date of Patent: May 8, 2012

(54) APPARATUS AND METHOD FOR IMPROVING CAM USAGE

(75) Inventors: Michael Shamis, Netanya (IL); Roman Ronin, Petah Tikva (IL); Tal Anker, Modiin (IL)

(73) Assignee: Marvell International Ltd., Hamilton (BM)

( * ) Notice: Subject to any disclaimer, the term of this patent is extended or adjusted under 35 U.S.C. 154(b) by 383 days.

(21) Appl. No.: 12/435,830

(22) Filed: May 5, 2009

Related U.S. Application Data

(60) Provisional application No. 61/050,390, filed on May 5, 2008.

(51) Int. Cl.
*G06F 13/00* (2006.01)
*G11C 15/00* (2006.01)

(52) U.S. Cl. .............. 711/108; 365/49.1; 365/49.16; 365/49.17; 365/49.18

(58) Field of Classification Search .............. 711/108; 365/49.1, 49.16, 49.17, 49.18; 370/392, 370/351
See application file for complete search history.

(56) References Cited

U.S. PATENT DOCUMENTS

| | | | |
|---|---|---|---|
| 6,137,707 A | 10/2000 | Srinivasan et al. | |
| 6,892,237 B1 * | 5/2005 | Gai et al. | 711/108 |
| 6,934,795 B2 * | 8/2005 | Nataraj et al. | 711/108 |
| 7,389,377 B2 * | 6/2008 | Gupta | 711/108 |
| 7,516,119 B1 * | 4/2009 | Kao | 711/108 |
| 2001/0038636 A1 * | 11/2001 | Nanduri et al. | 370/419 |
| 2004/0172346 A1 * | 9/2004 | Kanekar et al. | 705/30 |

OTHER PUBLICATIONS

Pagiamtzis et al., "Content-Addressable Memory (CAM) Circuits and Architectures: A Tutorial and Survey," *IEEE Journal of Solid-State Circuits*, vol. 31, No. 3, pp. 712-727, Mar. 2006.

\* cited by examiner

*Primary Examiner* — J. H. Hur

(57) ABSTRACT

A network apparatus comprises a plurality of ports, and a forwarding engine coupled to the plurality of ports. The forwarding engine is configured to transfer data units received via at least some of the plurality of ports to one or more appropriate ports in the plurality of ports. The forwarding engine comprises a content addressable memory (CAM) device to store a plurality of data patterns organized in a plurality of groups, wherein the CAM device is configured to, responsive to input data, output in a single cycle a plurality of match indications corresponding to the plurality of groups. The forwarding engine also comprises a logic device coupled to the CAM device and configured to generate an action value based on the plurality of match indications, wherein the action value indicates an action to be taken by the forwarding engine.

20 Claims, 6 Drawing Sheets

APPARATUS AND METHOD FOR IMPROVING CAM USAGE

CROSS-REFERENCES TO RELATED APPLICATION

The present application claims the benefit of U.S. Provisional Application No. 61/050,390, entitled "IMPROVING TCAM USAGE" filed on May 5, 2008, which is hereby incorporated by reference herein in its entirety.

FIELD OF TECHNOLOGY

The present disclosure relates generally to digital circuits, and more particularly, to circuits for detecting patterns in data.

BACKGROUND

A content addressable memory (CAM) is a type of computer memory that allows for high speed searches of a specific data pattern within its memory cells, which are organized as an array having rows and columns. A different data pattern may be stored in each row of the CAM. Data to be checked can be supplied to an input of the CAM, and the CAM may then compare the input to each row of the CAM array. If the CAM determines that the input matches one or more rows, the CAM returns a signal indicating the row or rows that match. Typically, if more than one row matches the input data, the CAM returns a signal indicating only one of the matching rows based on some priority scheme. For example, the highest matching row in the CAM may be indicated.

A CAM may be used to determine whether a certain data pattern is in a stream of data, such as data read from a hard disk drive or data received via a network. This may be useful for example, for making forwarding decisions, virus detection, network intrusion detection, etc., e.g., at a network switch. For instance, the stream of data may be analyzed to determine if it includes any data patterns that match any of the entries in a list (dictionary) of known virus patterns stored in the CAM. Upon detection of a pattern match relating to a virus, desired actions could be taken such as further analysis, repair, quarantine, or deletion of the data containing the virus. As another example, a network security device may analyze an incoming packet to determine if it is from one of several IP source addresses stored in the CAM. Upon match of a source IP address in the CAM, desired actions could be taken such as forwarding the packet, dropping the packet, trapping the packet for further analysis, etc.

Several different functions or applications may utilize one CAM. In the context of network security, for example, an "IP source guard" application may utilize the CAM to identify packets having particular Internet Protocol (IP) source addresses, and a "Syn flood attack" application may utilize the CAM to identify packets with the "Syn" flag set in the Transmission Control Protocol (TCP) header. When several applications utilize a CAM, each application may have a plurality of patterns (or rules) that the application seeks to identify using the CAM. Generally, each rule corresponds to one row in the CAM. But when multiple applications utilize the CAM, the rules of the different applications may multiply each other (sometimes referred to as "Cartesian multiplication"). For example, if there are three applications, A, B, and C, each having a set of ten rules, the total number N of rules that need to be stored in the CAM may be N=10*10*10=1000 (i.e., 1000 rows of storage needed in the CAM). To avoid Cartesian multiplication, multiple CAM lookups may instead be utilized, but increasing the number of lookups may decrease throughput and/or increase costs.

SUMMARY OF THE DISCLOSURE

In one embodiment, a network apparatus comprises a plurality of ports, and a forwarding engine coupled to the plurality of ports. The forwarding engine is configured to transfer data units received via at least some of the plurality of ports to one or more appropriate ports in the plurality of ports. The forwarding engine comprises a content addressable memory (CAM) device to store a plurality of data patterns organized in a plurality of groups, wherein the CAM device is configured to, responsive to input data, output during a single cycle a plurality of match indications corresponding to the plurality of groups. The forwarding engine also comprises a logic device coupled to the CAM device and configured to generate an action value based on the plurality of match indications, wherein the action value indicates an action to be taken by the forwarding engine.

In another embodiment, an apparatus comprises a ternary content addressable memory (TCAM) device to store a plurality of data patterns organized in a plurality of groups, wherein, the TCAM device is configured to, responsive to input data, output a plurality of match indications corresponding to the plurality of groups. The apparatus also comprises a memory device coupled to the TCAM device to store action values indicative of actions to be taken in response to match indications, and to store action combination information that indicates how each action value is to be combined with other action values. Each action value corresponds to one of the patterns in the TCAM device, and the memory device includes a plurality of action value outputs corresponding to the plurality of groups and a plurality of action combination outputs corresponding to the plurality of groups. Additionally, the apparatus comprises a logic device coupled to the memory device to generate a combined action value based on a logical combination of the plurality of action value outputs and based on the plurality of action combination outputs. The logic device may be configured to generate the combined action value responsively to match indications that are output in a single cycle of the TCAM device.

In yet another embodiment, a method includes generating a key from a data packet received via a network, and providing the key to a CAM device that stores data patterns organized in a plurality of groups. The method additionally includes generating with the CAM device a plurality of match indications in response to detecting respective matches in two or more groups during a single cycle of the CAM device, wherein the match indications for each of the plurality are generated based on a priority. Also, the method includes performing an action on the data packet based on the plurality of match indications.

DETAILED DESCRIPTION

Figure 1:
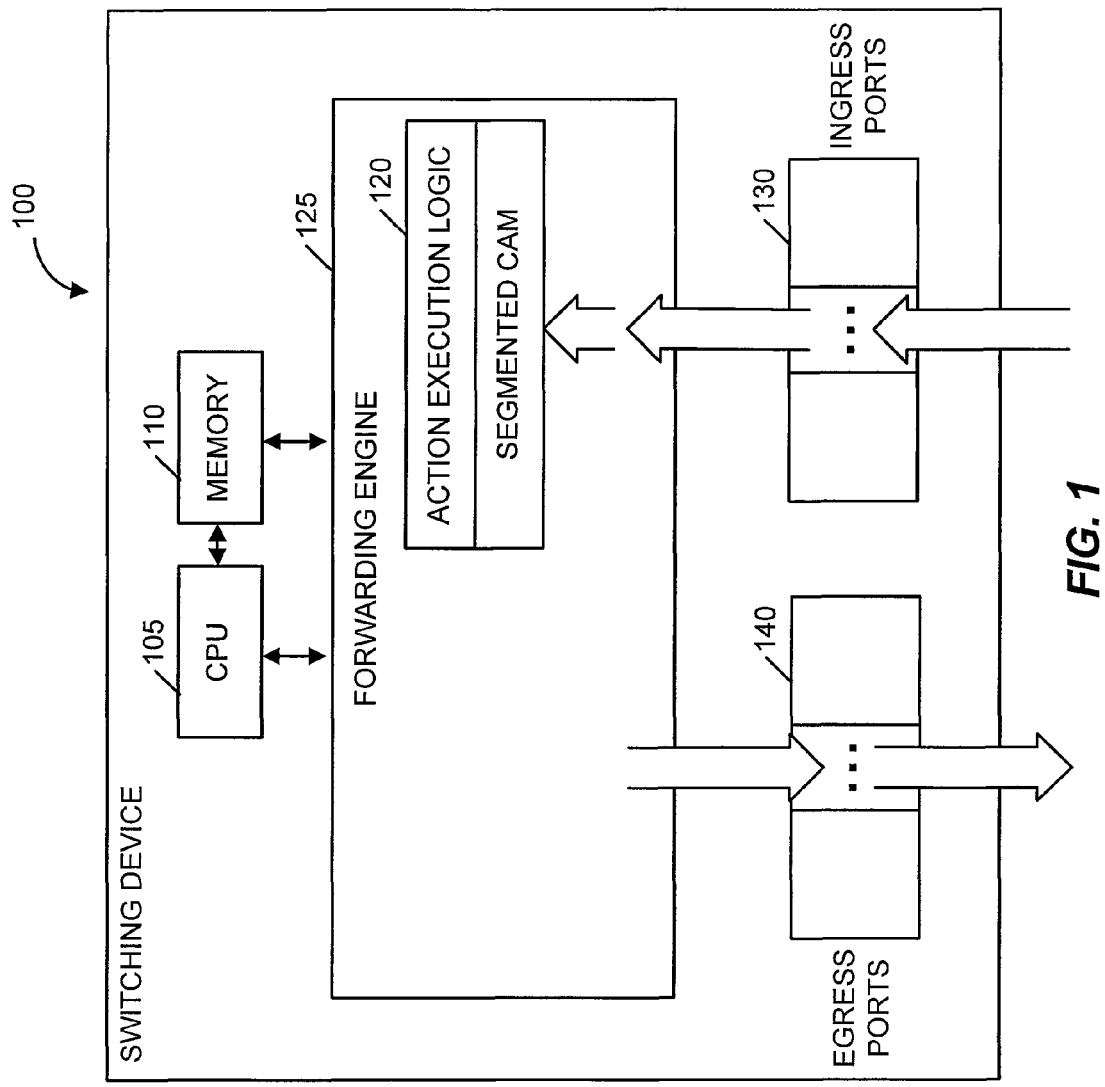
FIG. 1 is a simplified block diagram of an example switching device that may utilize a content addressable memory (CAM) system in accordance with an embodiment of the disclosure.

FIG. 1 is a simplified block diagram of an example switching device 100 that may utilize an embodiment of a content addressable memory (CAM) system 120 to be described in more detail below. Embodiments of such a CAM device may use a reduced number of rules and/or utilize a reduced number of lookups as compared to a prior art CAM device.

The switching device 100 is generally a computer networking device that can connect two or more computer systems, network segments, subnets, and so on. For example, the switching device 100 may be a router. It should be understood, however, that the switching device 100 is not necessarily limited to a particular protocol layer or to a particular networking technology (e.g., Ethernet). For instance, the switching device 100 could also be a bridge, a VPN concentrator, etc.

The switching device 100 includes one or more ingress ports 130 and one or more egress ports 140. The ingress ports 130 are generally configured to receive data units (e.g., packets), and the egress ports 140 are generally configured to transmit data units. Optionally, some or all of the ingress ports 130 and the egress ports 140 may be capable of both receiving data units and transmitting data units. The ingress ports 130 and the egress ports 140 are coupled together via a forwarding engine 125, which generally transfers data units from the ingress ports 130 to one or more appropriate egress ports 140, and which may perform additional packet processing functions, such as network security functions. The switching device 100 also may include a central processing unit (CPU) 105 coupled to the forwarding engine 125. The CPU 105 may execute computer readable instructions stored in a memory 110 coupled to the CPU 105.

The forwarding engine 125 generally performs wire speed functions associated with transferring data units from ingress ports 130 to egress ports 140, whereas the CPU 105 generally performs functions that can tolerate higher latency, for example only on selected data units. The memory 110 also may be coupled to the forwarding engine 125. The forwarding engine 125 may be implemented in hardware, e.g., on a single application specific integrated circuit (ASIC) coupled to the CPU 105. In other embodiments, other types of integrated circuits may be used such as a field programmable gate array (FPGA), a programmable logic array (PLA), a custom integrated circuit, etc. In other embodiments, the forward engine 125 may be implemented on multiple different integrated circuits that are coupled together.

The forwarding engine 125 includes the CAM system 120. A key utilized by the CAM system 120 may be generated based on information in a packet received via one of the ingress ports 130. For example, a key may be generated using information in a header of the packet. The CAM system 120 generally checks whether the key matches any patterns stored in the CAM system 120. When a match is detected, the CAM system 120 may generate data that indicates one or more actions that should be taken with respect to the packet. Examples of actions to be taken may include, forwarding the packet to another processing unit within the forwarding engine 125 for further processing of the packet, dropping the packet, mirroring the packet to the CPU 105 and/or the memory 110, trapping the packet to the CPU 105 and/or the memory 110, changing one or more fields in the packet header, etc.

In accordance with an embodiment of the disclosure, the CAM system 120 includes a segmented CAM device that is organized into groups and, is configured to output a plurality of match indications corresponding to the plurality of groups for a single lookup. The CAM system 120 also includes action execution logic that indicates an action to be performed based on a combination of the plurality of match indications.

Figure 2:
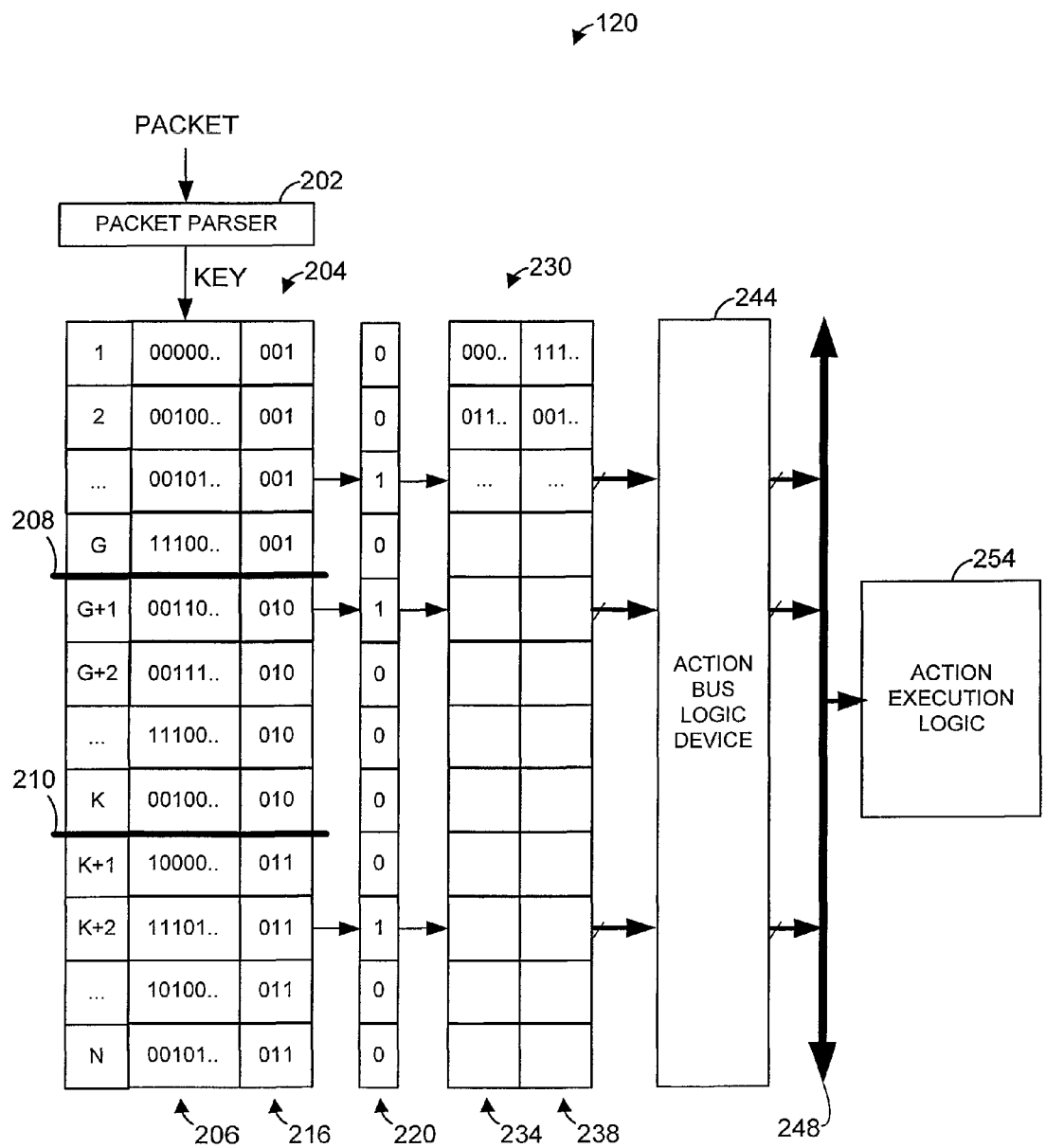
FIG. 2 is a block diagram of an example of the CAM system utilized in the switching device of FIG. 1.

FIG. 2 is a more detailed block diagram of an example of the CAM system 120 in accordance with one embodiment. The CAM system 120 includes a packet parser 202 that receives a packet and generates a key based on the received packet. The key is an input to a CAM device 204, and the CAM device 204 generally determines whether the key matches any patterns stored in the CAM device 204. The packet parser 202 alternatively may receive, and generate the key using, only a portion of a packet such as a header of the packet, or selected portions of the header. Similarly, the packet parser 202 alternatively may receive, and generate the key using, a packet descriptor generated using a packet or a portion of a packet. The packet parser 202 may utilize other information in generating the key such as configuration information, packet type information, etc. In some embodiments, the packet parser 202 may be separate from the CAM system 120 and/or shared with other components of a larger system that includes the CAM system 120 (e.g., a switching device). In one embodiment, the packet parser 202 may be a component of a packet processor.

The CAM device 204 may be a ternary CAM (TCAM) device for example, configured to determine matches with patterns that may include "don't care" bits. The CAM device 204 generally receives the key and compares the key to patterns 206 stored in N rows (i.e., each pattern is stored in a separate row). The CAM device 204 is configured to store the patterns 206 organized as a plurality of groups, and to generate a match output corresponding to each group. In one embodiment, the CAM device 204 is configured to utilize a first match per group matching scheme. In other embodiments, other matching schemes may be utilized. In FIG. 2, lines 208 and 210 signify demarcations between groups of patterns 206. For example, a first group corresponds to rows 1 through G of the CAM device 204, a second group corresponds to rows G+1 through K, and a third group corresponds to rows K+1 through N. Although three groups are illustrated in FIG. 2, different numbers of groups may also be utilized, such as two groups or three or more groups. Also, although each group in FIG. 2 is illustrated as corresponding to contiguous rows in the CAM device 204, rows corresponding to a group could be non-contiguous. For example, a group identifier (ID) may be associated with each row to indicate the group to which the row corresponds. In FIG. 2, column 216 indicates group IDs associated with each row of the CAM device 204. In one embodiment, the group ID for a row may be stored with the pattern in a portion of the row of the CAM device 204 that is not compared with the key. In another embodiment, the group IDs may be stored in another memory device that is separate from the memory device in which the patterns 206 are stored.

In one embodiment, the CAM device 204 is configured to have a fixed number of groups, with each group having a corresponding fixed number of rows. In the example of FIG. 2, the CAM device 204 may be configured to have three groups, each group having some fixed number of rows, such as 50 or some other suitable number (optionally, the groups may have different numbers of rows, e.g., a first group has 50 rows, whereas second and third groups each have 25 rows). For example, the CAM device 204 may comprise a plurality of separate CAMs, each CAM corresponding to one of the groups. As another example, the CAM device 204 may include a plurality of priority encoders, each priority encoder coupled to a subset of the rows of the CAM device 204. In this example, each priority encoder corresponds to a respective one of the groups and is configured to output one or more prioritized matches for its corresponding group. In embodiments in which the number of groups and the number of rows in each group is fixed, the use of group IDs optionally may be omitted.

In other embodiments, the CAM device 204 may be configured such that the number of groups and/or the number of lines corresponding to each group is configurable. In these embodiments, the group IDs may be utilized to determine which rows correspond to which groups. In these embodiments, the CAM device 204 may include a plurality of priority encoders, and configurable logic (not shown in FIG. 2) that couples selected rows of the CAM device 204 to selected priority encoders. The configurable logic may be configured by the CPU 105 (FIG. 1) for example.

The CAM device 204 includes a plurality of match outputs corresponding to the plurality of groups (e.g., each match output corresponds to a respective one of the groups). Each match output indicates match information for the corresponding group. Thus, the CAM device 204 is configured to determine whether patterns match the key and, if there are matches in multiple groups, to generate multiple match outputs that indicate the matches in the multiple groups. In one embodiment, the multiple match outputs, one for each of the multiple groups for example, are generated in one lookup cycle. In one embodiment, the plurality of match outputs may be in the form of a match vector 220. In the example match vector 220 illustrated in FIG. 2, the ones indicate the rows that match the key, and the zeros indicate rows that do not match the key (or, if they do match the key, were a lower priority match). Thus, in the example match vector 220 illustrated in FIG. 2, the CAM device 204 detected three matches, one match in each of the three groups. Optionally, the match vector 220 may be stored in a register, for example, wherein each bit in the register corresponds to a row of the CAM device 204. If no match occurs in a particular row, the corresponding bit in the register may be cleared (e.g., to zero). If a match does occur, the corresponding bit in the register may be set (e.g., to one). In the embodiment of FIG. 2, the match indications are prioritized for each group such that one match indication is output for each group. In other embodiments, there may be up to two or more match indications per group. Alternatively, the match vector may be indicative of all matches of input data against rows in the CAM device 204.

The CAM system 120 also comprises a memory device 230 having a plurality of memory locations. The memory device 230 also includes a plurality of selection inputs and a plurality of outputs. In one embodiment, the memory device 230 may comprise a register set including a register for each line in the CAM device 204. Each register may have a corresponding selection input coupled to one of the bits in the match vector 220, and each register may have an output. In this embodiment, a one bit in the match vector 220 may cause contents of the corresponding register to be output from the register set.

In another embodiment, the memory device 230 may comprise a random access memory (RAM) device. Each selection input may specify one of the memory locations, and contents of the specified memory location are provided on a respective output. In one embodiment, the memory device 230 may comprise a plurality of separate memory devices, each memory device having one selection input and one output. This embodiment may be utilized, for example, when the CAM device 204 is configured to have a fixed number of groups, with each group having a corresponding fixed number of rows. In another embodiment, the memory device 230 may comprise a multiport memory device. Each selection input of the multiport memory device may permit selection of any of the memory locations in the multiport memory device. This embodiment may be utilized, for example, when the CAM device 204 is configured such that the number of groups and/or the number of lines corresponding to each group is configurable.

The selection inputs of the memory device 230 are coupled to the plurality of match outputs of the CAM device 204, and each storage unit in the memory device 230 may correspond to a row in the CAM device 204. As discussed previously, each match output of the CAM device 204, when a match is detected, indicates the row in the CAM device 204 that matched. Thus, the match output of the CAM device 204 may be used to select the corresponding storage unit in the memory device 230.

In one embodiment, the memory device 230 stores indications of actions that should be taken in response to the detections of various patterns in the CAM device 204. These indications may be referred to as "action values." Each action value may indicate actions that should be taken in response to a corresponding match determined by the CAM device 204. The memory device 230 also stores action combination information for the action values. In one embodiment, action combination information for a particular action value may be stored in the same storage unit as the action value and may provide information regarding how the action value is to be combined with other action values to form a combined action value. For example, an action value may be stored in a first set of bits of the storage unit and the corresponding action combination information may be stored in a second set of bits of the storage unit. In this embodiment, an output of the memory device 230 may comprise an action value output and an action combination data output.

In another embodiment, action combination information corresponding to an action value may be stored in a storage unit associated with the storage unit of the action value. For example, if the memory device 230 comprises a RAM, the action value and action combination information may be stored in adjacent locations. In yet another embodiment, the memory device 230 may comprise separate memory devices to store action values and corresponding action combination, information. For example, a first memory device may store action values and a second memory device may store action combination information. In this embodiment, selection inputs of the second memory device may be coupled to the plurality of match outputs of the CAM device 204 so that storage units of action values in the first memory correspond with storage units of action combination information in the second memory. In this embodiment, an output of the first memory device may comprise an action value output and an output of the second memory device may comprise a corresponding action combination data output.

In one embodiment, the combined action value may indicate the actions to be taken in response to multiple matches corresponding to the multiple groups in the CAM device 204. Combining action values will be described in more detail below. In another alternative embodiment, the match vector may be used by a suitable logic device to indicate the actions to be taken in response to multiple matches corresponding to the multiple groups in the CAM device 204.

In FIG. 2, action values are illustrated as stored in a column 234, and action combination information is illustrated as stored in a column 238. In one embodiment, action combination information for particular action values may comprise respective action masks. The action mask for a particular action value may indicate, for example, which bits of the action value must appear in the combined action value, and which bits of the action value need not appear in the combined action value.

In response to the CAM device 204 detecting matches in a plurality of groups, selected action values and action combination information are output by the memory device 230. For example, respective action values and respective action combination information values corresponding to matches in respective groups may be output on respective outputs of the memory device 230.

The CAM system 120 also includes an action bus logic device 244 coupled to the memory device 230. The action bus logic device 244 is configured to generate the combined action value based on a logical combination of the plurality of action value outputs. The combined action value is output to an action value bus 248. The action bus logic device 244 may utilize the action combination information in generating the combined action value. For example, if the action combination information includes action masks, the action bus logic device 244 may utilize the action masks to perform masking operations on the action values output by the memory device 230. Then, the masked action values may be logically combined, which may include, for example by ORing at least portions of the masked action values. An embodiment of the action bus logic device 244 is described below.

The CAM system 120 also may include action execution logic 254 coupled to the action bus logic device 244 via the action bus 248. In one embodiment, the action execution logic 254 may receive the combined action value and analyze the combined action value to determine the actions to be taken. The action execution logic 254 also may implement or initiate the actions to be taken. In some embodiments, the action execution logic 254 may be separate from the CAM system 120 and/or shared with other components of a larger system that includes the CAM system 120 (e.g., a switching device).

In operation of one embodiment, the packet parser 202 may receive a packet (or a packet header, packet descriptor, etc.) and, in response, may generate a key. The key is provided to the CAM device 204. In a single lookup operation or cycle, the CAM device 204 may generate multiple match outputs corresponding to the multiple groups. The multiple match outputs are provided to the memory device 230.

In response to the multiple match outputs from the CAM device 204, the memory device 230 may retrieve a plurality of action values and action combination information corresponding to the multiple groups. The retrieved information is provided on the multiple outputs of the memory device 230.

The retrieved action values and action combination information corresponding to the multiple groups are then provided to the action bus logic device 244, which generates a combined action value. The action execution logic receives the combined action value and, in response, analyzes the combined action value to determine the actions to be taken.

Actions may be categorized in two or more categories. For example, a first category may correspond to actions that may be associated with multiple groups or that may be utilized by multiple applications without regard to possible actions taken by other applications. In the context of network security applications or switching devices (e.g., the switching device 100 of FIG. 1), actions in this category may include, for example, forwarding the packet, hard dropping the packet, soft dropping the packet, mirroring the packet, trapping the packet, etc.

A second category of actions may correspond to actions that can only be performed in connection with certain groups or that may be utilized only with certain applications and/or may need to be disabled in response to a conflicting action being taken by another application. In the context of network security applications or switching devices (e.g., the switching device 100 of FIG. 1), actions in this category may include, for example, Differentiated Services Code Point (DSCP) field remarking, virtual local area network (VLAN) priority (VPT) field remarking, counting, traffic policing, setting an egress queue, etc. For example, it may be desired to allow only one application to remark the DSCP field of a packet to avoid a conflict wherein two different applications seek to remark the DSCP to different values.

The action bus logic device 244 may include logic to resolve conflicts between multiple actions in the first category discussed above. Conflicts related to actions in the second category discussed above can be handled via programming of the memory device 230 with action values and action combination information. For example, the memory device 230 could be programmed so that the same action type cannot be defined in more than one group. As an illustrative example, the DSCP action may be permitted in only one group.

Figure 3:
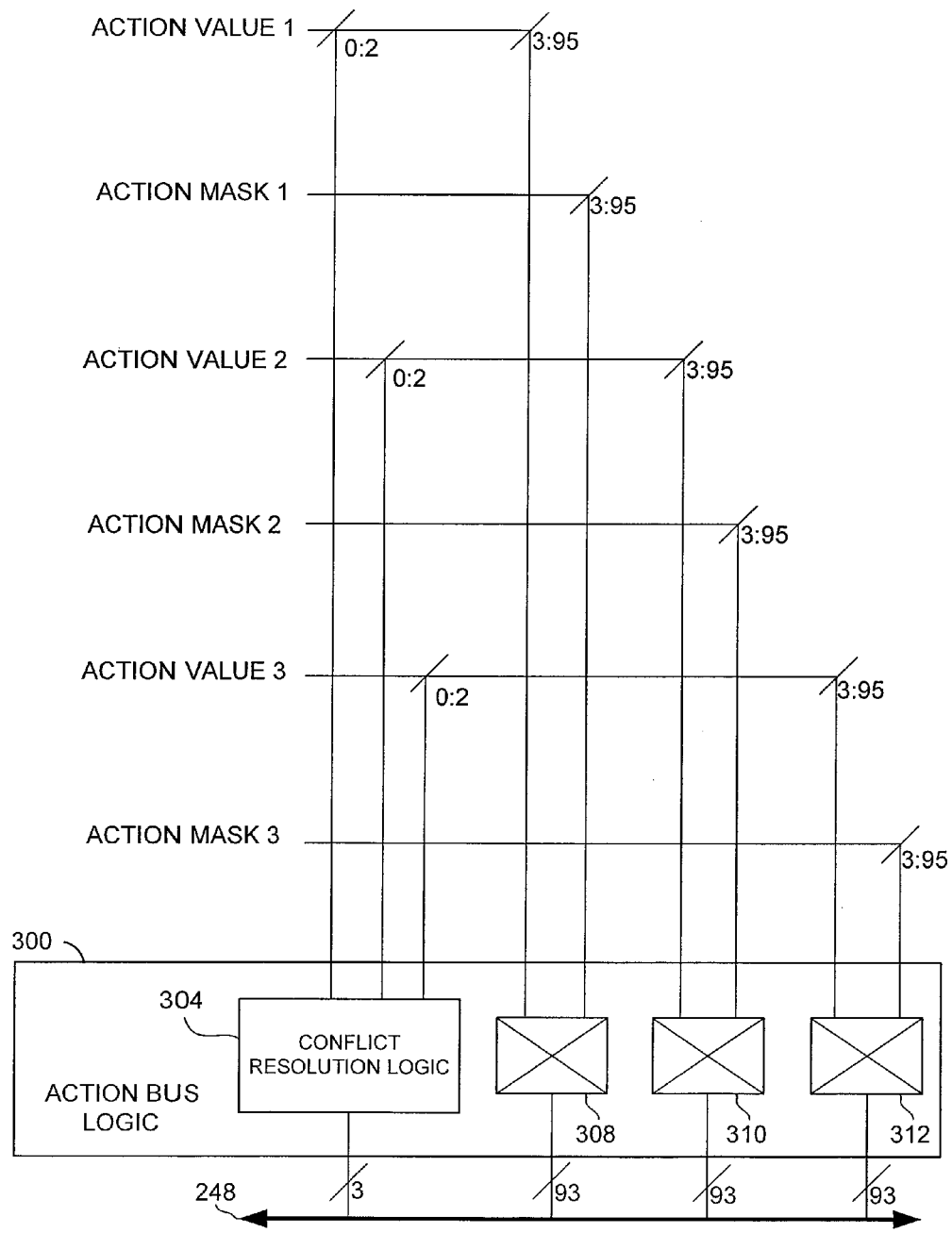
FIG. 3 is a block diagram of a logic device that could be used with the CAM system of FIG. 2.

FIG. 3 is a block diagram of an example action bus logic device 300 in accordance with an embodiment. The example action bus logic device 300 may be utilized as the action bus logic device 244 in the system of FIG. 2. It is noted, however, that the action bus logic device 300 may be utilized in a CAM system other than the CAM system 120 of FIG. 2, and that the CAM system 120 may utilize an action bus logic device other than the action bus logic device 300.

In FIG. 3, it is assumed that the action bus logic device 300 receives action values and action combination information (e.g., action mask values) corresponding to three groups. It is noted, that in other implementations, there may be different numbers of groups and thus the action bus logic device 300 may receive a different number of action values, for example.

The action bus logic 300 includes conflict resolution logic 304 that receives the first three bits from each of the three action values. The first three bits of each of the three action values may correspond to indications of actions from the first category described above. The conflict resolution logic 304 generally resolves conflicts between actions indicated by the first three bits of each of the three action values and generates an action indication on the first three bits of the action bus 248. For example, if the first three bits of action value 1 indicates a forwarding action whereas the first three bits of action value 1 indicates a hard dropping action, the conflict resolution logic 304 may choose the hard dropping action and output and output an indication of the hard dropping action. In other embodiments, a different number of bits may correspond to indications of actions from the first category (e.g., one, two, or four or more bits). Similarly, in the example of FIG. 3, the action values, the actions masks, and the action bus 248 are illustrated as having a width of 96 bits. In other embodiments, different widths may be utilized.

The action bus logic 300 also includes a plurality of three-state buffer circuits 308, 310, 312 that mask the action values with their corresponding action masks so that only specified bits of each action value (indicated by the mask values) are allowed to propagate to the bus 248.

Figure 4:
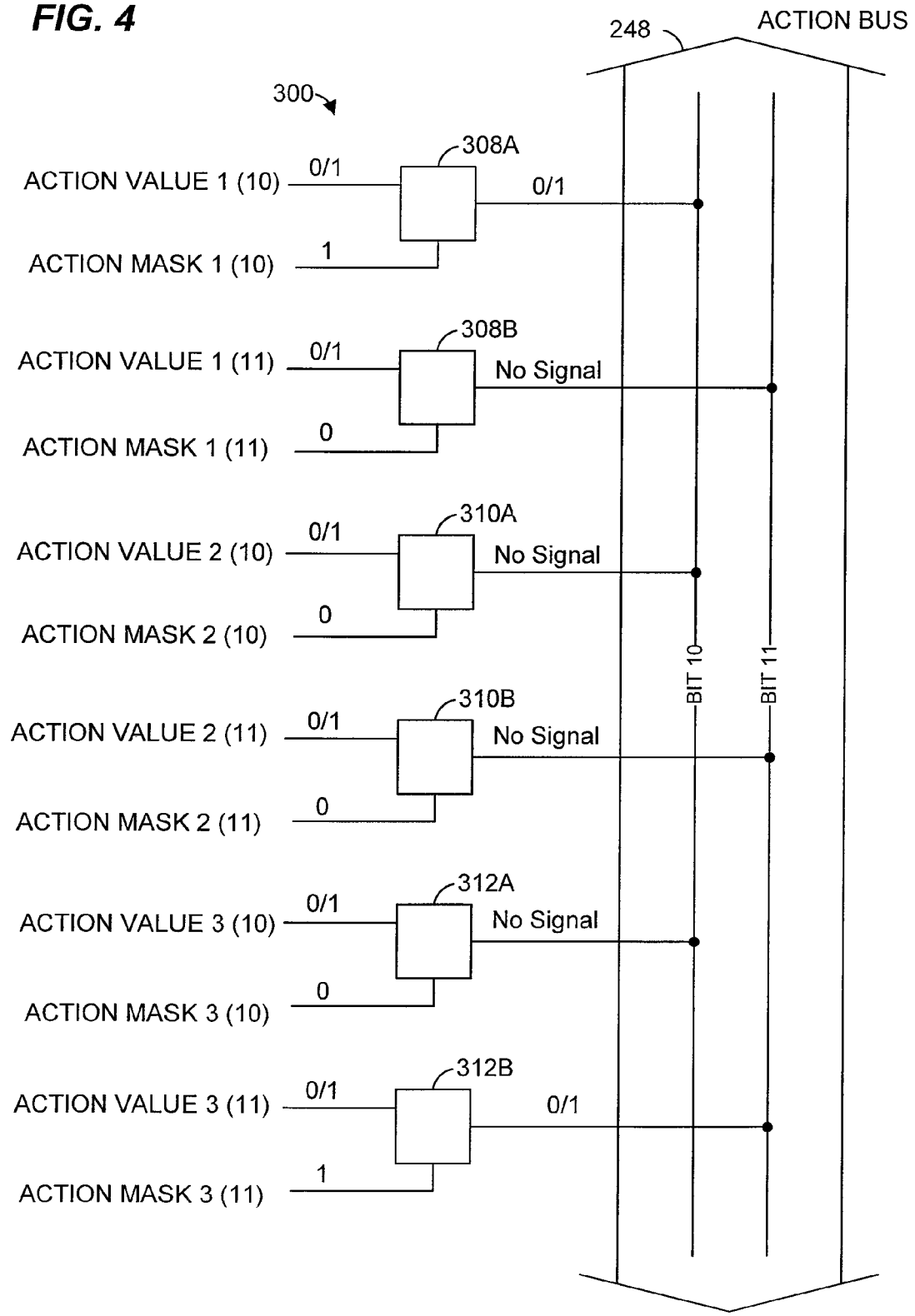
FIG. 4 is a block diagram of a portion of the action bus logic of FIG. 3.

FIG. 4 is a block diagram of a portion of the action bus logic 300 relating to the three-state buffer circuits 308, 310, 312. In particular, FIG. 4 illustrates the portions of the three-state buffer circuits 308, 310, 312 relating to bit 10 and bit 11 of the action values, action masks, and the action bus 248 of FIG. 3. Three-state buffers 308 act to selectively permit bit 10 and bit 11 of Action Value 1 to propagate to bit 10 and bit 11, respectively, of the action bus 248, based on bit 10 and bit 11, respectively of the Action Mask 1. For example, as illustrated in FIG. 4, bit 10 of Action Mask 1 is high, so three state buffer 308A permits bit 10 of Action Value 1 to propagate to bit 10 of the action bus 248. On the other hand, bit 11 of Action Mask 1 is low, so three state buffer 308B does not permit bit 11 of Action Value 1 to propagate to bit 11 of the action bus 248. Three-state buffers 310 act to selectively permit bit 10 and bit 11 of Action Value 2 to propagate to bit 10 and bit 11, respectively, of the action bus 248, based on bit 10 and bit 11, respectively of the Action Mask 2. For example, as illustrated in FIG. 4, bit 10 and bit 11 of Action Mask 2 are low, so the three state buffers 310A, 310B do not permit bit 10 and bit 11 of Action Value 2 to propagate to bit 10 and bit 11 of the action bus 248. Similarly, three-state buffers 312 act to selectively permit bit 10 and bit 11 of Action Value 3 to propagate to bit 10 and bit 11, respectively, of the action bus 248, based on bit 10 and bit 11, respectively of the Action Mask 3. For example, as illustrated in FIG. 4, bit 10 of Action Mask 3 is low, so three state buffer 312A does not permit bit 10 of Action Value 3 to propagate to bit 10 of the action bus 248. On the other hand, bit 11 of Action Mask 3 is high, so three state buffer 312B permits bit 11 of Action Value 3 to propagate to bit 11 of the action bus 248.

In another embodiment, three-state AND gates may be utilized instead of the three-state buffers illustrated in FIG. 4, and respective action value bits and respective action mask bits may be provided as inputs to respective three-state AND gates. In another embodiment, instead of using three-state components, a plurality of AND gates and OR gates may be utilized. For example, respective action value bits and respective action mask bits may be provided as inputs to respective AND gates, and outputs of the AND gates corresponding to each bit of the bus 248 may be coupled to inputs of respective OR gates, and the outputs of the OR gates may be coupled to the bus 248.

Referring again to FIG. 1, data stored in the CAM system 120 (e.g., patterns, group IDs, action values, action masks values, etc.) may be loaded by the CPU 105, for example. The CPU 105 may configure the CAM system 120 to prevent, when suitable, two different applications from seeking to invoke the same action type in response to a single match. Additionally, the CPU 105 may create unique group IDs for various applications that are to utilize the CAM system 120, and load rules for each application with the appropriate group ID. Further, the CPU 105 may create action values and corresponding action combination information (e.g., action masks) and load them in the memory device 230.

Figure 5:
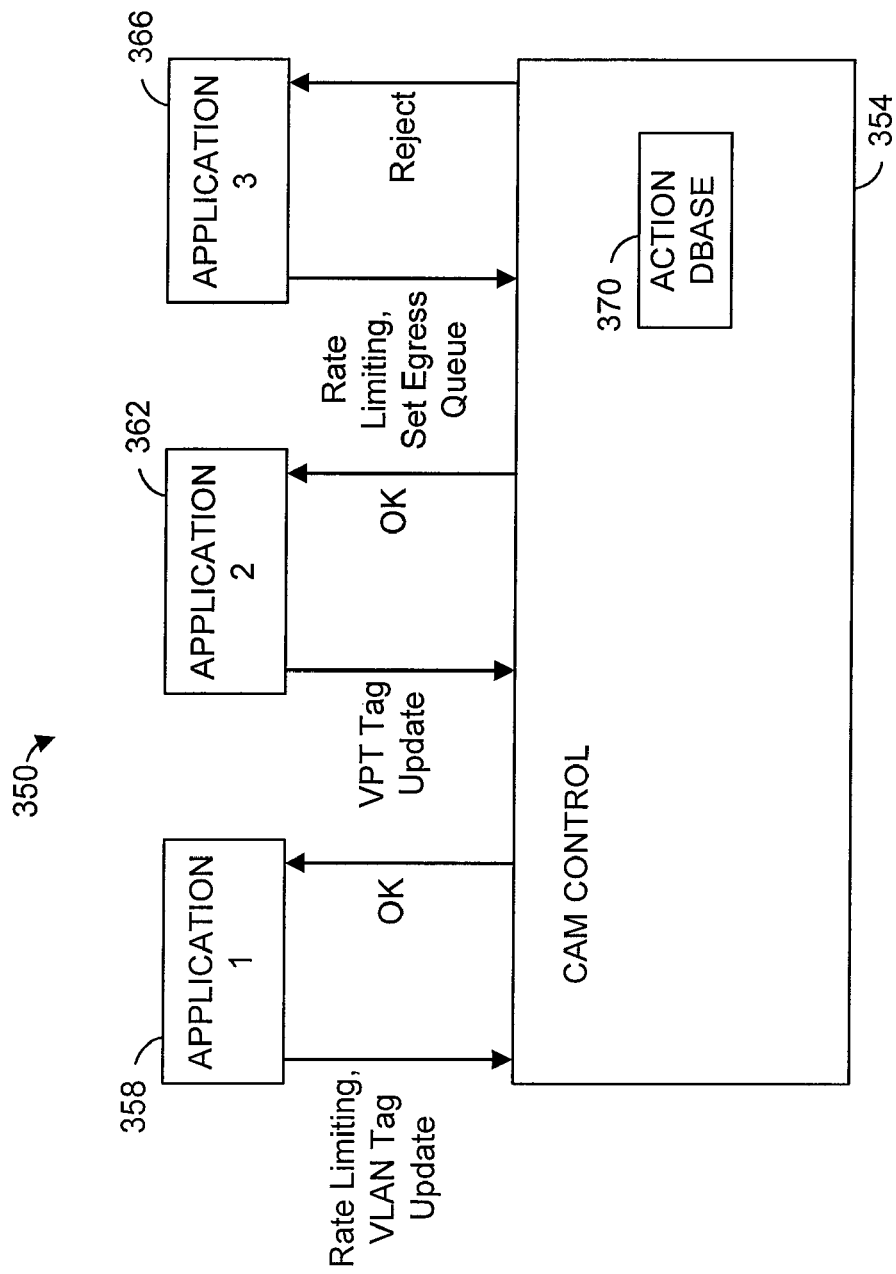
FIG. 5 is a block diagram of an example system for configuring the CAM system of FIG. 2.

FIG. 5 is a block diagram of an example system 350 that may be implemented by a processor such as the CPU 105 of FIG. 1 executing machine readable instructions. The system 350 generally configures the CAM system 120. The system 350 includes a CAM control unit 354 coupled to three applications: Application 1 (358), Application 2 (362) and Application 3 (366). The CAM control unit 354 generally manages CAM rules, actions (indicated by action values), bind ingress/egress ports to rules, etc. The applications 358, 362, 366 generally seek to utilize the CAM system 120 to initiate actions. In order to do so, each application 358, 362, 366 should register itself within the CAM control unit 354.

During registration, the application should declare actions that it seeks to use. During the registration process, the CAM control unit 354 examines an action database 370 to determine if the action that an application seeks to use has already been registered by another application. If the action is not found in the database 370, the CAM control unit 354 may determine that the application may utilize the CAM system 120, and may store an indication of the action (or actions) in the database 370. Additionally, the CAM control unit 354 may send an indication that the registration was accepted to the application. Additionally, the CAM control unit 354 may create rules and a unique group ID, and load the rules and group ID into the CAM device 104. Further, the CAM control unit 354 may create action values and corresponding action combination information (e.g., action masks) and load them in the memory device 230 for the actions declared by the application. If action masks are utilized, an action mask may unmask registered actions, whereas other bits will be masked.

If the action is found in the database 370, the CAM control unit 354 may determine that the application may not utilize the CAM system 120 (or, may utilize the CAM system 120 for other actions, but not for actions already found in the database 370). Additionally, the CAM control unit 354 may send an indication that the registration was not accepted to the application.

In FIG. 5, application 358 is illustrated sending a registration request indicating two actions 1) rate limiting, and 2) VLAN tag update. The CAM control unit 354 examines the database 370 and, having not found the rate limiting action and the VLAN tag update, sends an indication that the registration was accepted to the application 358. Then, application 362 sends a registration request indicating a VPT tag update action. The CAM control unit 354 examines the database 370 and, having not found the VPT tag update action, sends an indication that the registration was accepted to the application 362. Then, application 366 sends a registration request indicating two actions 1) rate limiting, and 2) set egress queue. The CAM control unit 354 examines the database 370 and finds that the rate limiting action was previously registered by application 358. Thus, the CAM control unit 354 sends an indication that the registration failed to the application 366. The indication may indicate that the application 366 is not registered at all, or that the application 366 is registered only with respect to the set egress queue action.

Figure 6:
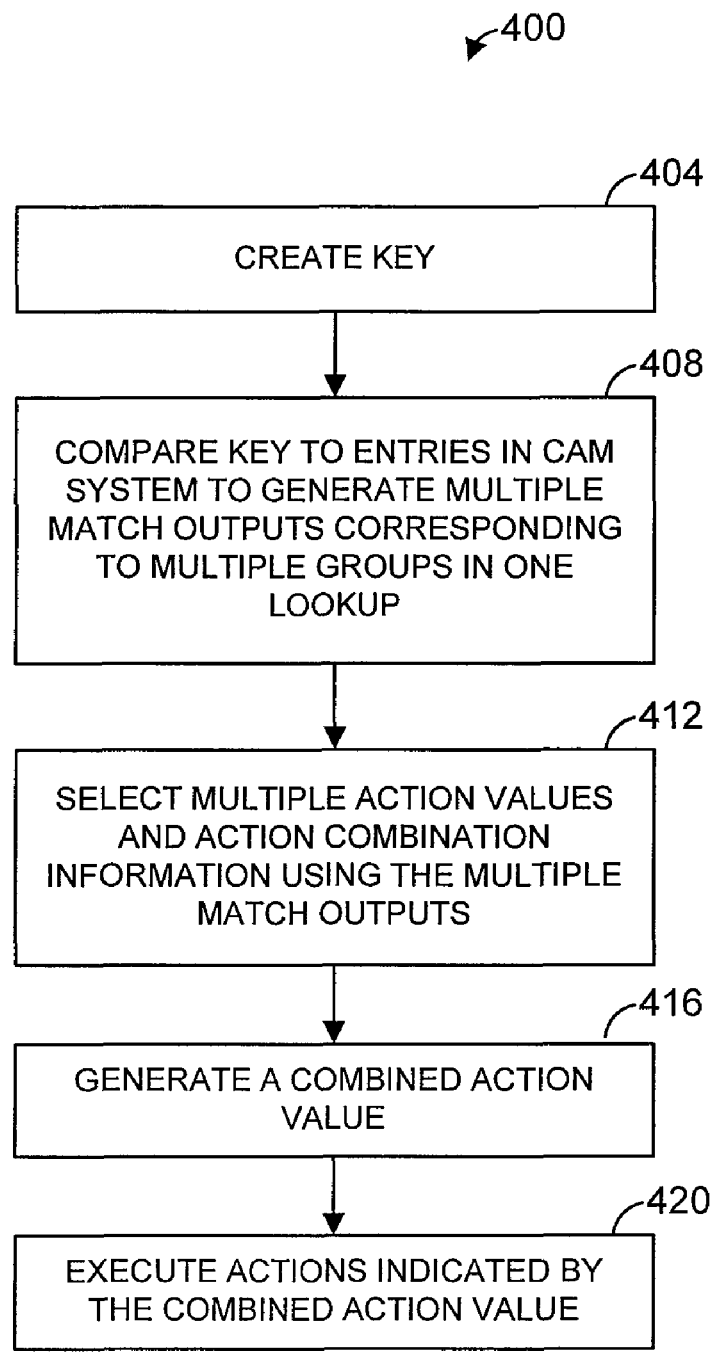
FIG. 6 is a flow diagram of an example method for executing actions in response to detecting patterns in a packet, data stream, etc.

FIG. 6 is a flow diagram of an example method 400 for executing actions in response to detecting patterns in a packet, data stream, etc. The method 400 may be implemented using a CAM system such as the system of FIG. 2 and, for ease of explanation, the method 400 will be described with reference to FIG. 2. It will be understood, however, that the method 400 may be implemented in a CAM system other than the CAM system 120 of FIG. 2.

At block 404, a key is generated. For example, a key may be generated from a packet, packet header, packet descriptor, etc. as described above. Referring to FIG. 2, the packet parser 202 may generate the key. In other implementations, the key could be generated from a data stream such as date read from a disk, for example.

At block 408, the key is provided to a CAM device in which data patterns are stored and organized in a plurality of groups. The CAM device compares the key to the data patterns and generates a plurality of match outputs corresponding to the plurality of groups. The plurality of match outputs may be generated in one lookup cycle. Referring to FIG. 2, the CAM device 204 utilizes the key to generate the plurality of match outputs corresponding to the plurality of groups in one lookup cycle.

At block 412, multiple action values and action combination information is selected using the plurality of match outputs. Each action value indicates one or more actions to be taken in response to a match between the key and one or more data patterns in the corresponding group. Referring to FIG. 2, multiple action values and action combination information are retrieved from the memory device 230 utilizes using the plurality of match outputs.

At block 416, a combined action value is generated using the multiple action values and the action combination information. Referring to FIG. 2, the action bus logic device 244 may generate the combined action value.

At block 420, the action or actions indicated by the combined action value is taken. Referring to FIG. 2, the action execution logic device 254 may interpret the combined action value and execute the indicated one or more actions or at least initiate the execution of the indicated one or more actions.

The various blocks, operations, etc., described above with respect to FIGS. 2-4 may be implemented in hardware, such as in one or more custom integrated circuits, application specific integrated circuits (ASICs), field programmable gate arrays (FPGAs), etc. The various blocks, operations, etc., described above with respect to FIG. 5 may be implemented using a processor executing machine readable software and/or firmware instructions. The software/firmware may be stored in any computer readable memory such as on a magnetic disk, an optical disk, or other storage medium, in a RAM or ROM or flash memory of a computer, processor, hard disk drive, optical disk drive, tape drive, etc. Likewise, the software/firmware may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium).

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A network apparatus, comprising:
    a plurality of ports;
    a forwarding engine coupled to the plurality of ports, the forwarding engine configured to transfer data units received via at least some of the plurality of ports to one or more appropriate ports in the plurality of ports, wherein the forwarding engine comprises:
    a content addressable memory (CAM) device to store a plurality of data patterns organized in a plurality of groups, wherein the CAM device is configured to, responsive to input data, output during a single cycle a plurality of match indications corresponding to the plurality of groups, and wherein the CAM device is configured to output at most one match indication for each group;
    a memory device coupled to the CAM device to store action values indicative of actions corresponding to the plurality of data patterns, wherein the memory device includes a plurality of action value outputs corresponding to the plurality of groups, wherein the memory device is configured so that i) each action value corresponds to a respective one of the data patterns in the CAM device, and ii) action values corresponding to a same type of action to be taken correspond to only one group; and
    a logic device coupled to the CAM device and configured to generate an action value based on the plurality of match indications, wherein the action value indicates an action to be taken by the forwarding engine.

2. An apparatus according to claim 1, wherein the CAM device comprises a plurality of separate CAM devices, wherein each separate CAM device generates a corresponding one of the match indications.

3. An apparatus according to claim 1, wherein the CAM device comprises a plurality of priority encoders, wherein each priority encoder generates a corresponding one of the match indications.

4. An apparatus according to claim 1,
    wherein the logic device is configured to generate the action value as a combined action value based on a logical combination of the plurality of action value outputs.

5. An apparatus according to claim 4, wherein the memory device is configured to store action combination information that indicates how each action value is to be combined with other action values;
    wherein the memory device includes a plurality of action combination information outputs corresponding to the plurality of groups; and
    wherein the logic device generates the combined action value further based on the plurality of action combination information outputs.

6. An apparatus according to claim 5, wherein the action combination information comprises a plurality of action masks, each action mask corresponding to a respective action value;
    wherein the logic device masks one or more portions of an action value output using the corresponding action mask; and
    wherein the logic device generates the combined action value further based on the plurality of action combination data outputs.

7. An apparatus according to claim 6, wherein the logic device comprises a plurality of logical multipliers to mask respective action values with respective action masks.

8. An apparatus according to claim 6, wherein the logic device comprises logic to resolve conflicts between at least portions of the action values.

9. An apparatus according to claim 6, wherein the forwarding engine further comprises an action execution device coupled to the logic device to receive the combined action value.

10. An apparatus according to claim 1, wherein the CAM device comprises a ternary CAM (TCAM) device.

11. An apparatus, comprising:
    a ternary content addressable memory (TCAM) device to store a plurality of data patterns organized in a plurality of groups, wherein the TCAM device is configured to, responsive to input data, output a plurality of match indications corresponding to the plurality of groups, and wherein the TCAM device is configured to output at most one match indication for each group;

a memory device coupled to the TCAM device to store action values corresponding to the plurality of data patterns and indicative of actions to be taken in response to match indications, and to store action combination information that indicates how each action value is to be combined with other action values, wherein each action value corresponds to one of the data patterns in the TCAM device and action values corresponding to a same type of action to be taken correspond to only one group, wherein the memory device includes a plurality of action value outputs corresponding to the plurality of groups and a plurality of action combination outputs corresponding to the plurality of groups; and a logic device coupled to the memory device to generate a combined action value based on a logical combination of the plurality of action value outputs and based on the plurality of action combination outputs.

12. An apparatus according to claim 11, wherein the memory device comprises a register set including a plurality of registers, and the logic device is configured to generate the combined action value responsively to match indications that are output in a single cycle of the TCAM device.

13. An apparatus according to claim 12, wherein each register in the plurality of registers corresponds to a respective row of the TCAM device.

14. An apparatus according to claim 12, wherein each register is configured to store a respective action value and corresponding action combination information.

15. An apparatus according to claim 11, wherein the memory device comprises a plurality of separate memory devices, wherein each separate memory device corresponds to a respective one of the groups and includes a selection input coupled to a respective one of the match indications.

16. An apparatus according to claim 11, wherein the memory device comprises a multiport memory device having a plurality of selection inputs coupled to the plurality of match outputs.

17. An apparatus according to claim 11, wherein the action combination information comprises a plurality of action masks corresponding to the action values; and wherein the logic device is configured to mask each action value with the corresponding action mask.

18. A method, comprising:

generating a key from a data packet received via a network;

providing the key to a CAM device that stores data patterns organized in a plurality of groups;

generating with the CAM device a plurality of match indications in response to detecting respective matches in two or more groups during a single cycle of the CAM device, wherein the match indications for each of the plurality are generated based on a priority and the CAM device is configured to output at most one match indication for each group;

retrieving a plurality of action values corresponding to matches between the key and data patterns in corresponding groups from a memory device coupled to the CAM device, wherein the memory device is configured so that i) each action value corresponds to a respective one of the data patterns in the CAM device, and ii) action values corresponding to a same type of action to be taken correspond to only one group; and performing an action on the data packet based on the plurality of match indications.

19. A method according to claim 18, further comprising:

logically combining the plurality of action values to generate a combined action value that indicates one or more actions to be taken in response to detecting the respective matches in the two or more groups.

20. A method according to claim 19, further comprising retrieving action combination information from the memory device using the plurality of match indications;

wherein logically combining the plurality of action values is based on the retrieved action combination information.

* * * * *